United States Patent [19]

Pennisi et al.

[11] Patent Number: 5,357,186
[45] Date of Patent: Oct. 18, 1994

[54] CIRCUIT FOR DETECTING THE INTER-PHASE VOLTAGE OF AN ALTERNATOR FOR IMPLEMENTING A REGULATOR ASSOCIATED WITH SUCH AN ALTERNATOR

[75] Inventors: Alessio Pennisi, Milan; Fabio Marchio, Gallarate, both of Italy; Jean-Marie Pierret, Paris; Didier Canitrot, Saint-Maur des Fosses, both of France

[73] Assignees: Valeo Equipements Electriques Moteur, Creteil, France; SGS-Thomson Microelectronics, Brianza, Italy

[21] Appl. No.: 900,015

[22] Filed: Jun. 17, 1992

[30] Foreign Application Priority Data

Jun. 18, 1991 [FR] France ................... 91 07436

[51] Int. Cl.$^5$ ................................. H03K 5/24
[52] U.S. Cl. ............................ 320/9; 307/494
[58] Field of Search ............... 307/262, 268, 296.4, 307/516, 514, 261, 592, 601, 350, 355, 530; 328/133, 28, 29, 158, 32, 35; 320/9, 21

[56] References Cited

U.S. PATENT DOCUMENTS

| 3,588,710 | 6/1971 | Masters ................... 328/133 |
| 4,791,313 | 12/1988 | Kno et al. ................ 307/296.4 |

FOREIGN PATENT DOCUMENTS

| 0191571 | 8/1986 | European Pat. Off. . |
| 0408436 | 1/1991 | European Pat. Off. . |
| 2159286 | 11/1985 | United Kingdom . |

OTHER PUBLICATIONS

Fairchild Semiconductor (A Fact Program Product) Sep. 1965.

Primary Examiner—Timothy P. Callahan
Assistant Examiner—My-Trang Nu Ton

[57] ABSTRACT

A detection circuit for detecting the voltage between phases of a polyphase alternator for the purpose of controlling the putting into operation of a regulator for regulating the charging of a motor vehicle battery by said alternator, the circuit comprising differential discrimination means for the amplitude of the voltage between a pair of phase signals delivered by the alternator. The differential discrimination means comprise a pair of transistors each constituting means for comparing the inter-phase voltage with a threshold voltage defined by its emitter-base junction voltage, said threshold voltages being of small magnitude and of opposite polarity with respect to each other.

12 Claims, 2 Drawing Sheets

CIRCUIT FOR DETECTING THE INTER-PHASE VOLTAGE OF AN ALTERNATOR FOR IMPLEMENTING A REGULATOR ASSOCIATED WITH SUCH AN ALTERNATOR

The present invention relates to a circuit for detecting the phase signal of a polyphase alternator for implementing a circuit for regulating the charging of a vehicle battery by means of said alternator when the alternator is rotating.

BACKGROUND OF THE INVENTION

Such a circuit constitutes the subject matter of the French patent application published under the No. 2 649 797 in the name of the Applicants. That application, whose contents is incorporated into the present description by reference, describes in detail the advantages of this type of detection, in particular with respect to wiring compatibility between various types of installation.

Such detection is based on the principle that a voltage appears between two phase terminals of the alternator when it is caused to rotate. The above-mentioned patent application describes an embodiment in which the voltage between the above-mentioned phases is compared with a threshold voltage, e.g. +0.6 volts. When the threshold is exceeded, a logic output of the circuit changes state to activate the regulation circuit and thereby apply the appropriate regulation current to the excitation winding of the alternator.

The present invention seeks firstly to provide a circuit which improves the reliability of inter-phase voltage detection in a manner that is extremely simple and cheap.

In addition, the above-mentioned known circuit suffers from a certain number of limitations. In particular, it can be improved with respect to immunity from interference signals, in particular at radio frequencies. Furthermore, that circuit does not reliably detect the fault situation in which there is a break in a link between the alternator and one or other of the inputs for the phase signals.

In both cases, the regulator can be put into operation when the alternator is not rotating (the engine is stopped), and this leads in particular to the vehicle battery being discharged.

The present invention also seeks to mitigate these limitations without increasing the complexity or the cost of the circuit.

SUMMARY OF THE INVENTION

The present invention thus provides a detection circuit for detecting the voltage between phases of a polyphase alternator for the purpose of controlling the putting into operation of a regulator for regulating the charging of a motor vehicle battery by said alternator, the circuit comprising differential discrimination means for the amplitude of the voltage between a pair of phase signals delivered by the alternator, wherein the differential discrimination means comprise a pair of transistors each constituting means for comparing the inter-phase voltage with a threshold voltage defined by its emitter-base junction voltage, said threshold voltages being of small magnitude and of opposite polarity with respect to each other.

BRIEF DESCRIPTION OF THE DRAWINGS

Embodiments of the invention are described by way of example with reference to the accompanying drawings, in which.

DETAILED DESCRIPTION

Figure 1:
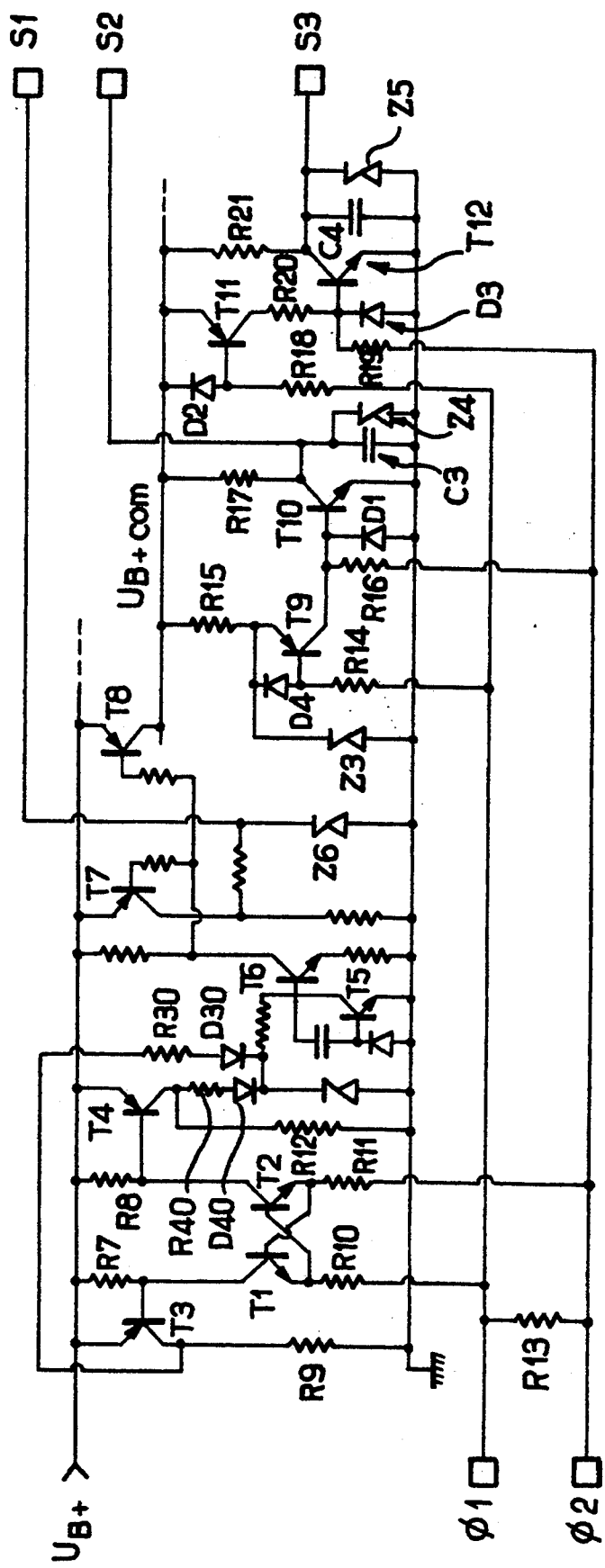
FIG. 1 is an electrical circuit diagram of a first embodiment of the invention.

With reference initially to FIG. 1, there can be seen a detection circuit of the invention which has two input terminals for signals $\phi1$ and $\phi2$ coming from two phases of the alternator. These two terminals are connected together by a resistor R13. The terminal $\phi1$ is connected via a resistor R10 to the emitter of an NPN transistor T1 and to the base of an NPN transistor T2. The terminal $\phi2$ is connected via a resistor R11 to the base of T1 and to the emitter of T2. The transistors T1 and T2 have respective collector resistors R7 and R8 connecting their collectors to a power supply line at a voltage $U_{B+}$ and connected to the positive terminal of the vehicle battery.

The collectors of T1 and T2 are connected to the bases of two PNP transistors T3 and T4 respectively. The emitters of T3 and T4 are both connected to the line $U_{B+}$, while their collectors are connected to ground via respective resistors R9 and R12.

The collectors of T3 and T4 are also connected to a treatment circuit via two respective resistors R30 and R40, and two diodes D30 and D40 constituting an OR gate.

The treatment circuit is built around transistors T5, T6, and T7 connected in cascade, and it constitutes a duty ratio discriminator circuit of the Miller integrator type, such as that described and shown in FIG. 4b of French patent application No. 2 649 797, to which reference may be made for further details.

A logic output terminal S1 is connected via a resistor to the collector of T7. This output S1 is applied to the regulator (not shown) to put it into operation when a high logic level is present on this output.

A transistor T8 has its base connected to the collector of T6 via a resistor. Its emitter is connected to the line $U_{B+}$ and its collector is connected to a switched power supply line $U_{B+COM}$.

The terminal $\phi1$ is also connected via a resistor R14 to the base of a PNP transistor T9. The collector of T9 is connected to the terminal $\phi2$ via a resistor R16. The emitter of T9 is connected firstly to a power supply line $U_{B+COM}$ via a resistor R15, secondly to the cathode of a diode D4, and thirdly to the cathode of a zener diode Z3. The anode D4 is connected to the base of T9. The anode of Z3 is connected to ground.

The collector of T9 is also connected to the base of an NPN transistor T10 and to the cathode of a diode D1. The anode of D1 is grounded. A resistor R17 is provided between the collector of T10 and the line $U_{B+COM}$, whereas its emitter is grounded. The collector of T10 is also connected to a logic output terminal S2 of the circuit, and to respective first terminals of a capacitor C3 and of a zener diode Z4 connected in parallel between said collector and ground.

The input terminal $\phi1$ is also connected via a resistor R18 to the base of a PNP transistor T11. This base is also connected to the anode of a diode D2 whose cathode is connected to the line $U_{B+COM}$. The emitter of T11 is connected to the same line, while its collector is connected to a first terminal of a resistor R20. The second terminal of R20 is connected firstly to a first terminal of a resistor R19, secondly to the cathode of a diode D3, and thirdly to the base of an NPN transistor T12. The second terminal of R19 is connected to the terminal $\phi 2$. The anode D3 is grounded as is the emitter of T12. Its collector is connected to the line $U_{B+COM}$ via a resistor R21, and to a logic output terminal S3. A capacitor C3 and a zener diode Z5 are connected in parallel between the collector of T12 and ground.

The operation of the FIG. 1 detection circuit is now described.

The purpose of the transistors T1 and T2 is to compare the inter-phase voltage $V_{\phi 2} - V_{\phi 1}$ with two determined threshold values which are defined by the emitter-base junction voltages of T1 and T2. These two threshold values are, for example, +0.6 volts (for T1) and −0.6 volts (for T2).

The transistors T3 and T4 are transistors for shaping the signals delivered by T1 and T2 when the above-mentioned thresholds are crossed.

While $V_{\phi 2} - V_{\phi 1}$ has a positive value greater than +0.6 volts, T1 and T3 are on and T2 and T4 are off. Conversely, as soon as $V_{\phi 2} - V_{\phi 1}$ has a negative value less than −0.6 volts, T2 and T4 are on and T1 and T3 are off. When the value of $V_{\phi 2} - V_{\phi 1}$ lies in the range −0.6 volts to +0.6 volts, T1, T2, T3, and T4 are all off.

The Miller integrator receives the logic signals from the transistors T3 and T4. By rejecting those threshold crossing detection signals corresponding to T3 or T4 being on that have a duty ratio which is small compared with the times during which the corresponding transistor is off, the output S1 is prevented from switching to a state in which the regulator circuit associated with the alternator is activated merely because short interference signals appear in the inter-phase voltage or because high frequency pulses appear therein due to switching transients.

Conversely, when one or other of these threshold voltages is exceeded with a significant duty ratio, that means that the vehicle alternator is rotating and the regulator must be put into operation. This is done by the logic output S1 switching to a high level via the Miller integrator.

The present invention is advantageous in that it makes it possible to compare the inter-phase voltage with two threshold voltages, respectively a positive threshold and a negative threshold, while using a circuit having two transistors T1 and T2 that is extremely simple and cheap, that is easy to integrate, and that then takes up very little silicon area. It may also be observed that these two transistors, and also T3 and T4, can be connected directly to the battery voltage $U_{B+}$. When the alternator is in its rest state, all of these transistors are off for most of the time, and indeed permanently in the absence of interference or switching transients, so the current they consume is negligible.

The portion of the circuit constructed around T9 and T10 serves to ensure that when the alternator is rotating, the peaks in the alternating phase signal $\phi 2$ cross two determined threshold voltages e.g. +0.6 volts and +7 volts. This condition is necessary in conventional manner for ensuring that an electronic revolution counter fitted to the vehicle and connected to this phase output operates properly, particularly with a diesel engine.

More precisely, when the voltage on terminal $\phi 1$ is greater than the voltage of zener diode Z3 minus the emitter-base junction voltage of T9 (i.e. +7 volts as mentioned above by way of example), then T9 is switched off. If, during this time, the voltage on $\phi 2$ is less than the emitter-base junction voltage of T10, then T10 is off. Output S2 thus takes up a high logic level, indicating that the peaks are crossing the thresholds and the revolution counter can operate normally. In contrast, as soon as one of the two above conditions is no longer satisfied, T10 switches on causing the output S2 to take up the low logic level. In a manner not shown, this has the effect of increasing the current flowing through the excitation winding of the alternator so that the above thresholds are again crossed as quickly as possible by the peaks of the phase signals.

The purpose of Z4 is to provide the voltage required for the high logic level on output S2. C3 prevents parasitic oscillation at the output S2.

The portion of the circuit built around T11 and T12 is to detect whether the amplitude of the difference between the signals $V_{\phi 1}$ and $V_{100\ 2}$ has a value of the same order of magnitude as the voltage $U_{B+COM}$, which is itself close to the output voltage of the alternator. The base-emitter junction voltages of T12 and T11 respectively define threshold voltages of about +0.6 volts and about −0.6 volts so as to determine whether the voltages $V_{\phi 1}$ and $V_{\phi 2}$ pass through the levels +0.6 volts and $U_{B+COM}$ −0.6 volts.

More precisely, if the voltage on $\phi 1$ is greater than $U_{B+COM}$ minus the emitter-base junction voltage of T11, then T11 is off. If, simultaneously, the voltage on $\phi 2$ is less than the emitter-base junction voltage of T12, then T12 is off and S3 delivers a high logic level indicating that there is no fault. If at any one instant one or other of the two above conditions is not satisfied, then T12 switches on and S3 takes up a low logic level.

This portion of the circuit thus delivers a signal on its output S3 that switches from one logic level to the other when the amplitude of the phase voltages $V_{100\ 1}$ and $V_{\phi 2}$ is sufficient. In contrast, if the amplitude in question is insufficient, then the signal S3 remains permanently at the high level, thereby indicating the fault.

The components Z5 and C4 have functions equivalent to those of the components Z4 and C3 as described above.

The purpose of transistor T8 is to switch the power supply line $U_{B+COM}$ which is used for powering the two circuits built around T9, T10 and T11, T12 to a voltage close to $U_{B+}$ only when the phase detection circuit has determined that the alternator is rotating and puts the regulator circuit into operation.

A variant embodiment of the invention is now described with reference to FIG. 2.

The portion of the circuit built around T1–T4, and the portions of the circuit built around T9, T10 and T11, T12 are the same as in FIG. 1 and are not described again.

In this variant, the Miller integrator is replaced by a different type of circuit for filtering and providing immunity against interference. More precisely, the collector of T3 is also connected to a first terminal of a resistor R1 whose second terminal is connected firstly to a first terminal of a resistor R2, secondly to the cathode of a zener diode Z1, and thirdly to the grid of a MOS-FET type transistor T40. The second terminal of R2 is connected to the drain of another MOS-FET transistor T30, and to the first terminal of a resistor R3. The second terminal of R3 is connected firstly to the reset to zero input RS of a first timing circuit constituted in this case by a binary up counter CT1, and secondly to a first terminal of a capacitor C1. The other terminal of C1, the anode Z1, and the source of T30 are all connected to ground.

The collector of T4 is connected to a first terminal of a resistor R4 whose second terminal is connected firstly to a first terminal of a resistor R5, secondly to the cathode of a zener diode Z2, and thirdly to the grid of T30. The second terminal of R5 is connected to the drain of T40 and to a first terminal of a resistor R6. The second terminal of R6 is connected firstly to the reset to zero input RS of a second timing circuit constituted by a binary up counter CT2, and secondly to a first terminal of a capacitor C2. The other terminal of C2, the anode of Z2, and the source of T4 are all connected to ground.

An input terminal CK for a clock signal, e.g. in the form of a squarewave signal at an appropriate frequency, is connected to the two count clock inputs Ck of the counters CT1 and CT2. The output S from each of the counters is constituted by one of the parallel binary output lines of the counter of well-determined weight, and it is connected to an enable En of the counter under consideration so as to configure the counters CT1 and CT2 as timers. A NOR gate P1 has its inputs connected to the two outputs S of the counters, and has its output connected to a logic output terminal S1 of the circuit.

Figure 2:
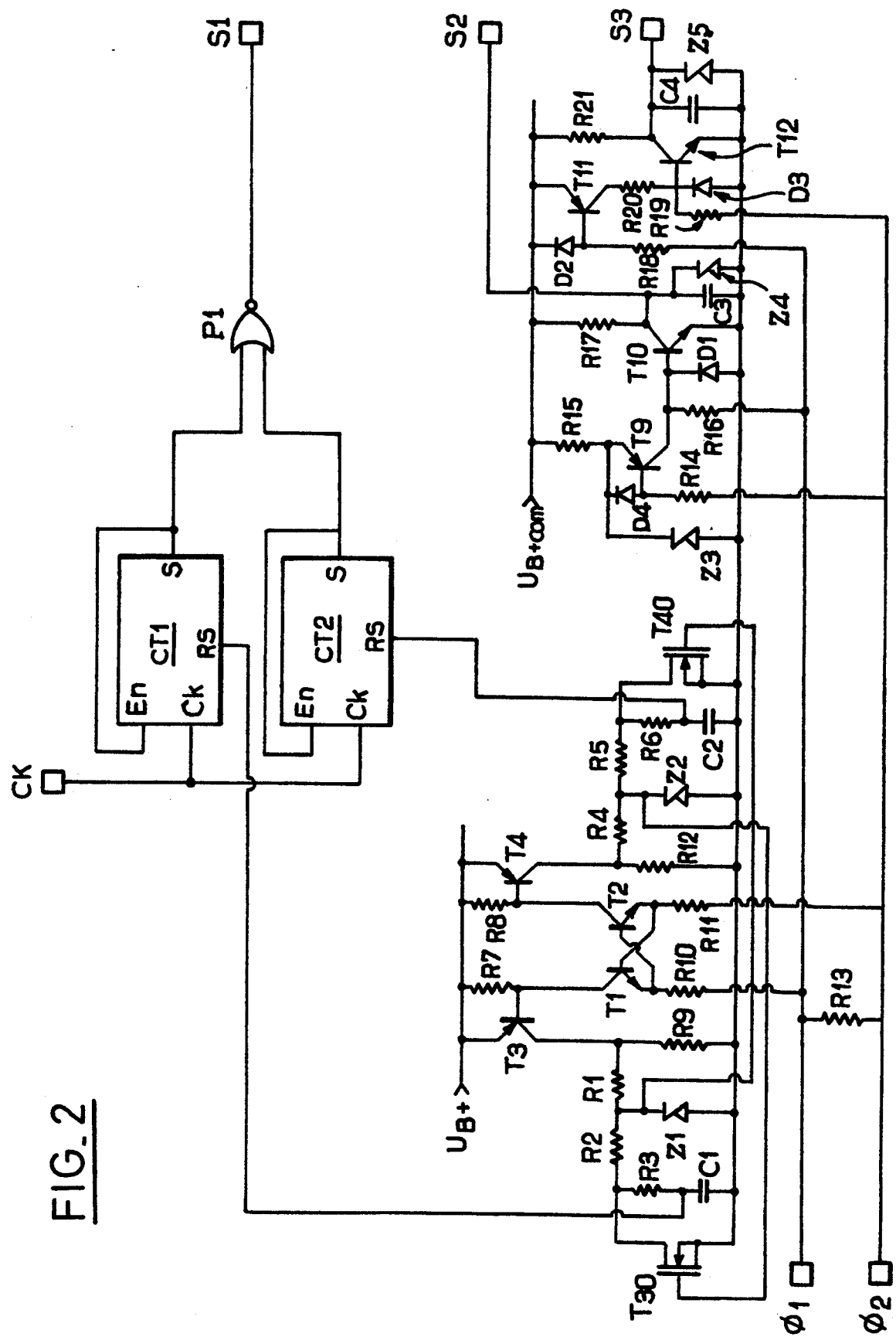
FIG. 2 is an electrical circuit diagram of a second embodiment of the invention.

The operation of the FIG. 2 circuit is now described in detail.

As before, the comparator circuit built around transistors T1–T4 switches on T3 or T4 as the case may be when the absolute value of the inter-phase voltage exceeds 0.6 volts.

The assemblies constituted firstly by components R1, R2, R3, C1, and T30 and secondly by R4, R5, R6, C2, and T40 constitute asymmetrical lowpass filters based on C1 and C2 charging slowly via resistors R1, R2, and R3 in one case and R4, R5, and R6 in the other, while said capacitors discharge more quickly via R3 or R6 alone whenever T30 or T40 is conducting.

More precisely, when the alternator is stopped, and initially assuming that there is no interference or the like, the voltage $V_{\phi 2} - V_{\phi 1}$ is zero. The transistors T1 to T4 are off. C1 and C2 therefore discharge slowly respectively via R3, R2, R1, R9, and R6, R5, R4, R12. The voltages applied to the RS inputs of the two counters are thus permanently at logic low levels. The counters CT1 and CT2 thus deliver high logic levels on their outputs S (possibly after a time delay due to counting) and the output S1 is at the low level, thereby indicating that the regulator circuit associated with the alternator should not be put into operation.

When the alternator is rotating, or in the presence of radio frequency interference, the voltage $V_{\phi 2} - V_{\phi 1}$ crosses the voltage thresholds set by T1 and T2 in alternation.

Initially, e.g. when $V_{\phi 2} - V_{\phi 1}$ becomes greater than +0.6 volts, T1 and T3 conduct. C1 charges slowly via R1, R2, R3. An instant later, T1 and T3 switch off again, and then T2 and T4 switch on. The avalanche voltage of zener diode Z2, e.g. +5 volts, is then applied to the grid of T30 which switches on to discharge C1 quickly via R3 only.

It will thus be understood that the level of the voltage present on C1 varies as a function of the frequency and of the duty ratio of the on/off periods of T3. Similarly, the level of the voltage on C2 varies as a function of the same criteria as applied to T4.

As a result, when only high frequency interference signals (typically at several hundreds of kilohertz) appear on the phase inputs, the periods of time during which T3 and T4 are on are too short to cause the voltage on C1 or C2 to rise to a level that is considered as being a high logic level by the associated counter CT1 or CT2. Similarly, when the interference is constituted by short voltage pulses that are spaced apart in time, thereby obtaining a low duty ratio, the voltage level on C1 or C2 does not rise far enough. The counters CT1 and CT2 are therefore not reset to zero and, as described above, the output of the gate P1 applies a low logic level on the terminal S1. The regulator circuit therefore remains inactive.

In contrast, when the alternator is rotating, because of the much lower frequency of the signal $V_{\phi 2} - V_{\phi 1}$, the voltages on C1 and C2 reach values that the counters CT1 and CT2 take as high logic levels, thereby resetting them to zero. The outputs S of these two counters therefore remain permanently at zero because the outputs S remain at zero for the time taken by the time delay, which time is designed to be greater than the duration of a half-cycle in the phase signal when the alternator is rotating at very low speed. The output S1 therefore takes up a high level which indicates that the regulator circuit of the alternator should be put into operation.

Further, when the alternator is not rotating and one of the connections between the alternator and the phase input $\phi 1$ and $\phi 2$ is broken, the voltage $V_{\phi 1} - V_{\phi 2}$ may be greater than 0.6 volts since these phase inputs are no longer brought to the same potential by the stator winding of the alternator. Asymmetrical behavior is then observed between transistors T1, T3 and T2, T4. For example, T1 and T3 may be conductive while T2 and T4 remain permanently off. Under such circumstances, the counter CT1 is reset to zero, but not the counter CT2. The two counters CT1 and CT2 therefore respectively deliver a low logic level output signal and a high logic level output signal. The output S1 is therefore at the low logic level and the regulator is not put into operation. Thus, in the event of a phase connection being broken when the engine is stopped, the circuit of the invention makes it possible reliably to avoid putting the regulator into operation which would cause the battery to be discharged.

To sum up, the regulator can be put into operation only when the alternator is rotating, and this applies even when the potentials $V_{\phi 1}$ and $V_{\phi 2}$ at the phase inputs are disturbed by high frequency interference or by a broken connection with the winding of the alternator stator.

The filtering performed by the capacitors C1 and C2, together with the timing provided by the counters CT1 and CT2 makes it possible to provide excellent immunity against high frequency interference of short duration that may appear on the terminals $\phi 1$ and $\phi 2$. In addition, the circuit of FIG. 2, like the circuit of FIG. 1, is very easily integrated on a single chip of silicon, taking up only a small area thereon.

The gate P1 combines the output signals from the two counters to cause the output signal on terminal S1 to take up a low level whenever at least one of the two counters is no longer being reset to zero.

Naturally, the present invention is not limited to the embodiments described above and shown in the drawings and the person skilled in the art will be able to make variants or modifications thereof within the spirit of the invention.

We claim:

1. A detection circuit for detecting a voltage difference between phases of a polyphase alternator for the purpose of controlling the putting into operation of a regulator for regulating the charging of a motor vehicle battery by said alternator, the circuit comprising differential discrimination means for comparing the difference in voltage between a pair of phase signals delivered by the alternator, wherein the differential discrimination means comprises a pair of first and second transistors each constituting means for comparing the difference in voltage between the pair of phase signals with first and second threshold voltages defined by their emitter-base junction voltages, respectively, said first and second threshold voltages being of small magnitude and of opposite polarity with respect to each other.

2. A detection circuit according to claim 1, wherein each of the transistors constituting the comparator means has its output connected to a signal shaping transistor.

3. A circuit according to claim 1, further including a filter circuit associated with each transistor.

4. A circuit according to claim 3, wherein each filter circuit comprises a capacitor charged at a first rate by the associated transistor being switched on and discharged via controlled switch means at a significantly higher second rate by the other transistor being switched on.

5. A circuit according to claim 4, further including a time delay circuit associated with each filter circuit, an output terminal of each time delay circuit changing logic state durably only when the voltage across the terminals of the capacitor in the associated filter circuit exceeds a predetermined voltage at a rate that is greater than a determined rate.

6. A circuit according to claim 5, wherein each time delay circuit comprises a binary counter having a reset to zero input that receives the voltage across the terminals of the capacitor of the associated filter circuit, and whose output is constituted by a high rank bit output.

7. A circuit according to claim 6, wherein the outputs of the two counters are connected to two inputs of a logic gate whose output is used for putting the regulator into operation.

8. A circuit according to claim 7, wherein the logic gate is a NOR gate.

9. A circuit according to claim 1, wherein the two transistors comprise a first bipolar transistor receiving said signal as its base-emitter voltage and a second bipolar transistor receiving the inverse of said signal as its base-emitter voltage.

10. A circuit according to claim 1, further including first additional comparator means for determining whether a phase signal voltage is below a third threshold voltage close to zero while another phase signal voltage is greater than a fourth threshold voltage close to half the battery voltage, so as to cause the excitation current in the alternator to be increased whenever this condition is not satisfied.

11. A circuit according to claim 10, further including second additional comparator means for determining whether a phase signal voltage is less than a fifth threshold voltage close to zero while another phase signal voltage is greater than a sixth threshold voltage close to the battery voltage, for the purpose of signalling a fault when said condition is not satisfied.

12. A circuit according to claim 11, wherein the first and second additional comparator means are powered only while the regulator circuit is being put into operation by the detection circuit.

* * * * *